Figure 1:
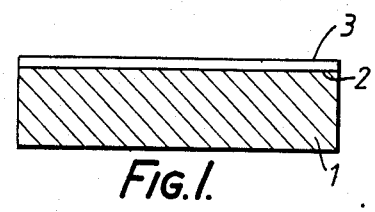

United States Patent [19]

Davies et al.

[11] Patent Number: 4,698,901
[45] Date of Patent: Oct. 13, 1987

[54] MESA SEMICONDUCTOR DEVICE

[75] Inventors: Ian Davies, Towcester; Sydney Cotton, Rugby; Anthony M. Howard, Towcester, all of England

[73] Assignee: Plessey Overseas Limited, Ilford, England

[21] Appl. No.: 902,245

[22] Filed: Aug. 29, 1986

[30] Foreign Application Priority Data

Aug. 31, 1985 [GB] United Kingdom ................ 8521726

[51] Int. Cl.$^4$ ........................................... H01L 21/301
[52] U.S. Cl. .................................... 437/209; 357/49; 357/81; 357/67; 357/56; 357/21; 156/644; 156/649; 437/902
[58] Field of Search ............... 357/56, 55, 21, 20, 357/49, 81, 67; 156/644, 649, 645; 29/580, , 583, 589

[56] References Cited

U.S. PATENT DOCUMENTS

| | | | |
|---|---|---|---|
| 3,820,236 | 6/1974 | Haitz | 29/583 |
| 3,849,217 | 11/1974 | Kroger et al. | 156/11 |
| 3,922,775 | 2/1975 | Potter | 357/81 |
| 3,993,515 | 11/1976 | Reichert | 357/56 |
| 4,197,551 | 5/1980 | Adlerstein | 357/56 |
| 4,319,265 | 3/1982 | Rosen et al. | 357/81 |
| 4,576,224 | 4/1986 | Eaton et al. | 357/81 |

Primary Examiner—Brian E. Hearn
Assistant Examiner—Beverly A. Pawlikowski
Attorney, Agent, or Firm—Michael F. Oglo; Julian C. Renfro

[57] ABSTRACT

A method of fabricating two terminal mesa semiconductor devices comprising etching a surface doped and metal coated silicon slice thereby to form a plurality of silicon frusta each capped by a metal contact pad, covering the frusta side of the slice with a metal contact continuity layer and then with a handle layer formed to lie parallel with that surface of the silicon slice which is remote from the frusta, lapping away the silicon slice to expose parts of the handle layer which extend between the frusta so that the frusta are separated so as to define discrete mesas held together by the handle layer, forming one of the two terminals on a face of the mesas remote from the contact pads, removing the handle layer to reveal the contact pads and bonding each contact pad thereby revealed to the metallized face of a diamond heat sink, one heat sink to each contact pad, which heat sink forms a part of the other of the two terminals of each mesa semiconductor device.

12 Claims, 10 Drawing Figures

MESA SEMICONDUCTOR DEVICE

This invention relates to two terminal mesa semiconductor devices and more especially it relates to methods of fabricating such devices.

Two terminal mesa semiconductor devices include silicon impatt diodes used for the generation of microwave energy as well as gun diodes and other semiconductor power devices.

One of the problems associated with such devices can be premature failure due to overheating. The cause of overheating in such devices is generally due at least in part to the inadequacy of heat sinks and it is an object of the present invention to provide an improved two terminal mesa semiconductor device which embodies an efficient integral heat sink having a very low thermal impedance.

According to the present invention a method of fabricating two terminal mesa semiconductor devices comprises etching a surface doped and metal coated silicon slice thereby to form a plurality of silicon frusta each capped by a metal contact pad, covering the frusta side of the slice with a metal contact continuity layer and then with a handle layer formed to lie parallel with that surface of the silicon slice which is remote from the frusta, lapping away the silicon slice to expose parts of the handle layer which extend between the frusta so that the frusta are separated so as to define discrete mesas held together by the handle layer, forming one of the two terminals on a face of the mesas remote from the contact pads, removing the handle layer to reveal the contact pads and bonding each contact pad thereby revealed to the metallised face of a diamond heat sink, one heat sink to each contact pad, which heat sinks form a part of the other of the two terminals of each mesa semiconductor device.

By fabricating a mesa semiconductor device in accordance with the invention having an integral diamond heat-sink, very low thermal impedance is afforded.

In order to hold the mesas together after the handle layer has been removed, the said one of the two terminals of each mesa may be stuck to a supporting substrate.

The supporting substrate may comprise a glass slide to which the mesas are stuck with wax.

The silicon slice may be surface doped to provide a P type epilayer sandwiched between an N type epilayer and a P+ contact layer, the P+ contact layer being metallised with a coating of chrome, platinum and then gold, which gold coating defines the surface of the metal contact pads.

The contact continuity layer may comprise a layer of gold which is overlaid with a copper handle layer, the copper handle layer being formed to lie parallel with that surface of the silicon slice which is remote from the frusta.

The said one of the two terminals may be formed by metallising the lapped surface of the silicon slice, laying down photo-resist to leave exposed contact regions of metallisation, and laying down gold terminal regions on the exposed contact regions.

The copper handle layer may be removed by etching so as to expose the contact pads.

The diamond heat sinks bonded to the contact pads may be mounted in gold studs.

One embodiment of the invention will now be described solely by way of example and with reference to FIGS. 1 to 10 of the accompanying drawing which comprise a number of somewhat schematic sectional views, corresponding parts of which bear the same numerical designation and which illustrate sequential steps in the process of fabricating a two terminal mesa semiconductor device.

Figure 6:
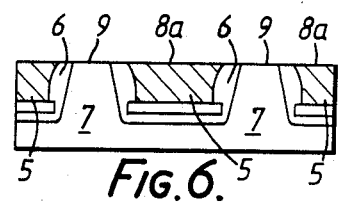
Figure 2:
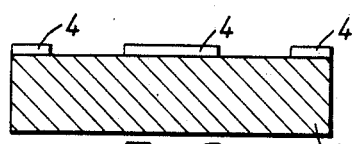
Figure 7:
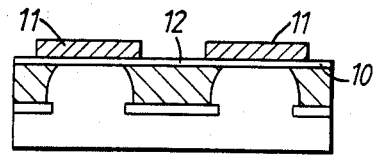
Figure 3:
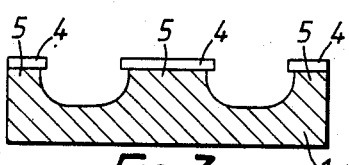
Figure 8:
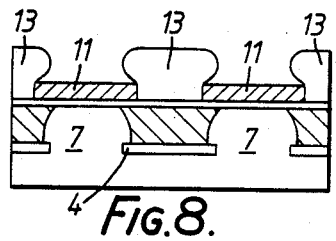
Figure 4:
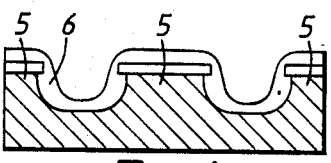
Figure 9:
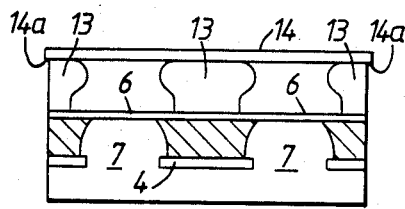
Figure 5:
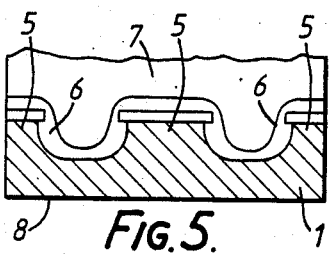
Figure 10:
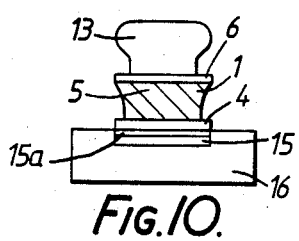

Referring now to FIG. 1 of the drawing, a two terminal mesa semiconductor device is fabricated from a silicon slice 1, a doped surface 2 of which is provided with a metallised coating 3. The doped surface 2 conventionally comprises a P type epilayer sandwiched between an N type epilayer and a P+ contact layer, which P+ contact layer supports the metallised coating 3. The metallised coating 3, which is not shown in detail, conventionally comprises a chrome layer which is layed down in contact with the P+ contact layer, a platinum layer and a gold surface layer. As shown in FIG. 2 the metallised coating 3 is selectively etched away to leave discoidal contact pads 4. As shown in FIG. 3, those parts of the silicon slice 1 which surround the contact pads 4 are etched away so that a plurality of frusta are formed each capped with one of the contact pads 4. The capped frusta 5 thereby defined, are coated with a gold contact continuity layer 6 as shown in FIG. 4 and a copper handle layer 7 as shown in FIG. 5, which is lapped to provide a surface 8a which lies parallel with the surface 8 of the silicon slice 1 which is remote from the frusta 5. The slice 1 is then inverted as shown in FIG. 6 and the surface 8 of the silicon slice 1 is lapped away so as to reveal surface parts 9 of the handle layer 7 and so that the frusta 5 are separated to define mesas held together by the handle layer 7. As shown in FIG. 7, the lapped surface 8a is metallised with a chrome, platinum, gold coating 10, which is similar to the coating 3. The metallised coating 10 is selectively covered with photo resist 11 so as to define contact regions 12 on which gold contact terminals 13 are deposited as shown in FIG. 8. The photo resist 11 is then removed and the terminals 13 are stuck to a glass slide 14 with a black wax film 14a as shown in FIG. 9. The copper handle layer 7 is then etched away so that the contact continuity layer 6 collapses to leave the individual mesa devices separately attached by means of the black wax film 14a to the glass slide 14. Each mesa device is then bonded to the metallised coating 15a of a diamond heat-sink 15 which is mounted on a gold stud 16. The metallised coating 15a of the diamond heat-sink 15 is a chrome, platinum, gold coating which is readily bonded to a contact pad 4 of each of the mesas so as to define a thin interface which facilitates good thermal conductivity.

It will be appreciated that the fore9oing manufacturing process allows the terminals 13 to be prepared whilst the mesas are retained in a suitable handle layer whereby the contact pad 4 can be kept thin as req ired to make the best thermal contact with the diamond heat-sink 15. By using a copper handle layer during the process, the need for a substantial contact pad 4 of sufficient thickness to provide mechanical strength is obviated, and the contact pad 4 can accordingly be kept thin as required for good thermal contact with the diamond heat-sink.

It is contemplated that the manufacturing process just before described will be particularly useful for the fabrication of microwave silicon impatt diodes although the process may equally well be applied to the manufacture of other silicon devices such as gunn diodes or silicon power rectifiers.

We claim:

1. A method of fabricating two terminal mesa semiconductor devices from a silicon slice having a doped surface region coated with a metal layer, the method comprising etching the silicon slice through the metal layer thereby to define a plurality of silicon frusta each capped by a metal contact pad, forming a metal contact continuity layer over the defined frusta and contact pads, forming a handle layer over the metal contact continuity layer, the handle layer extending between the frusta, lapping away the silicon slice to expose regions of the handle layer between the frusta, thereby to define discrete mesas cojoined by the handle layer, forming a first of the two terminals on a face of the mesas remote from the contact pads, removing the handle layer to reveal the contact pads, and bonding each revealed contact pad to the metallised face of a diamond heatsink, each heat sink forming part of the other of the two terminals of each mesa semiconductor device.

2. A method according to claim 1 wherein the first of the two terminals of each mesa semiconductor device is stuck to a supporting substrate.

3. A method according to claim 2 wherein the supporting substrate comprises a glass slide to which the mesas are stuck with wax.

4. A method according to any one of claims 1 to 3 wherein the metal contact continuity layer comprises gold.

5. A method according to claim 4 wherein the handle layer comprises copper.

6. A method according to claim 4 wherein the first of the two terminals is formed by metallising the lapped surface of the silicon slice, laying down photo-resist to leave exposed contact regions of metallisation, and laying down gold terminal regions on the exposed contact regions.

7. A method according to claim 5 wherein the copper handle layer is removed by etching so as to expose the contact pads.

8. A method according to claim 1 wherein the diamond heat sinks are mounted in gold studs.

9. A method according to claim 1 comprising coating the doped surface region of the silicon slice with the metal layer.

10. A method according to claim 9 wherein the metal layer comprises a coating of gold overlying a coating of platinum and a coating of chromium.

11. A method according to claim 1 wherein the doped surface region of the silicon slice comprises a P type epitlayer sandwiched between an N type epilayer and a P+ contact layer.

12. A method according to claim 6 wherein the metallisation on the lapped surface of the silicon slice comprises a coating of gold overlying a coating of platinum and a coating of chromium.

* * * * *